United States Patent [19]

Chapin

[11] 4,166,018

[45] Aug. 28, 1979

[54] SPUTTERING PROCESS AND APPARATUS

[75] Inventor: John S. Chapin, Boulder, Colo.

[73] Assignee: Airco, Inc., Montvale, N.J.

[21] Appl. No.: 438,482

[22] Filed: Jan. 31, 1974

[51] Int. Cl.$^2$ ............................................... C23C 15/00
[52] U.S. Cl. .................................. 204/192 R; 204/298
[58] Field of Search .................... 204/192, 298, 192 R

[56] References Cited

U.S. PATENT DOCUMENTS

| | | | |
|---|---|---|---|
| 2,146,025 | 2/1939 | Penning | 204/192 |
| 3,216,652 | 11/1965 | Knauer | 204/192 |
| 3,282,815 | 11/1966 | Kay et al. | 204/192 |
| 3,282,816 | 11/1966 | Kay | 204/192 |
| 3,325,394 | 6/1967 | Kay et al. | 204/192 |
| 3,369,991 | 2/1968 | Davidse et al. | 204/192 |
| 3,530,057 | 9/1970 | Muly, Jr. | 204/192 |
| 3,616,450 | 11/1971 | Clarke | 204/298 |
| 3,711,398 | 1/1973 | Clarke | 204/298 |
| 3,829,373 | 8/1974 | Kuehnle | 204/192 |
| 3,878,085 | 4/1975 | Corbani | 204/298 |

FOREIGN PATENT DOCUMENTS 736512 9/1955 United Kingdom.

OTHER PUBLICATIONS

W. Knauer and E. R. Stack, "Alternative Ion Pump Configurations Derived From a More Thorough Understanding of the Penning Discharge", Transactions of the Tenth National Vacuum Symposium, 1963, pp. 180-184.

Eric Kay, "Magnetic Field Effects on an Abnormal Truncated Glow Discharge and Their Relation to Sputtered Thin-Film Growth", Journal of Applied Physics, vol. 34, No. 4 (Part 1), Apr. 1963, pp. 760-768.

K. Wasa and S. Hayakawa, "Efficient Sputtering in a Cold-Cathode Discharge in Magnetron Geometry", Proc. of the IEEE, 55, 2179 (Dec. 1967).

S. D. Gill and E. Kay, "Efficient Low Pressure Sputtering in a Large Inverted Magnetron Suitable for Film Synthesis", Review of Scientific Instruments, 36:277-282 (Mar. 1965).

James R. Mullaly, "A Crossed-Field Discharge Device for High Rate Sputtering", RFP-1310, The Dow Chemical Company, Nov. 13, 1969, U.S. Atomic Energy Commission Contract AT(29-1)-1106.

I. G. Kesaev and V. V. Pashkova, "The Electro Magnetic Anchoring of the Cathode Spot", Sov. Phys. Tech. Phys., vol. 3, pp. 254-264 (1959) [English Translation of Zh. Tekh. Fiz., vol. 29, pp. 287-298 (1959)].

K. Wasa and S. Hayakawa, "Low Pressure Sputtering System of the Magnetron Type", Rev. Sci. Inst., vol. 40(5), pp. 693-697 (1969).

A. M. Dorodnov, "Some Applications of Plasma Accelerators in Technology", pp. 330-365 in Fisika i Primenenie Plasmennich Uskoritelej (A. I. Morosov, Ed.) Nauka i Tehnike, Minsk (1974).

J. R. Mullaly, "Crossed Field Discharge Device for High Rate Sputtering," Research/Development, vol. 22, pp. 40, 42, and 44 (Feb. 1971).

Primary Examiner—O. R. Vertiz
Assistant Examiner—Wayne A. Langel
Attorney, Agent, or Firm—David A. Draegert; E. W. Bopp; Larry R. Cassett

[57] ABSTRACT

Sputtering apparatus is described in which a magnetic field is formed adjacent a planar sputtering surface, the field comprising arching lines of flux over a closed loop erosion region on the sputtering surface.

11 Claims, 2 Drawing Figures

U.S. Patent
Aug. 28, 1979
4,166,018
FIG. 1.
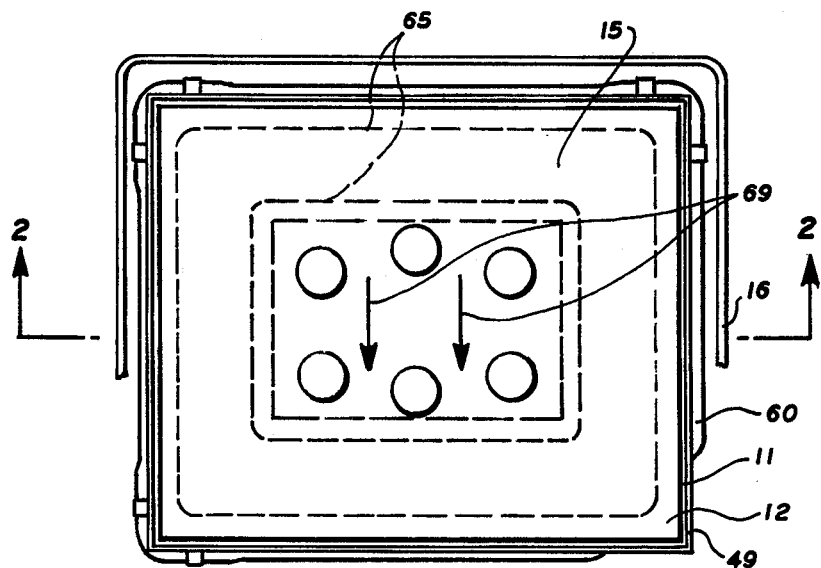
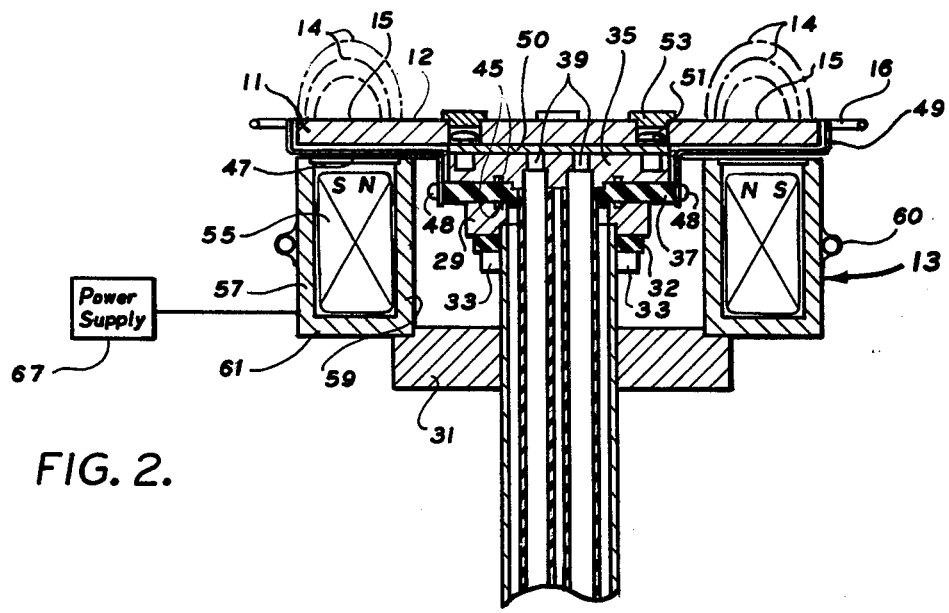
FIG. 2.

SPUTTERING PROCESS AND APPARATUS

This invention relates to sputtering apparatus for coating a substrate and, more particularly, to sputtering apparatus having an improved cathode configuration producing a higher rate of deposition of the sputtered material on a substrate than obtainable in prior art devices.

The technique of sputtering in order to produce a deposit on a substrate is well known. Sputtering typically involves the disintegration (erosion) of a cathode by causing gas ions in a low pressure environment to impinge upon the cathode and pysically eject atoms from the cathode surface. The ejected atoms are then caused to impinge upon a substrate placed in a suitable location to be in the path of the ejected atoms, thereby resulting in a deposit on the surface of the substrate.

Sputtering apparatus has assumed many forms in the prior art. Typically, an electric field is utilized in order to accelerate the ions in the gas and cause them to impinge upon the cathode surface. In addition, some forms of sputtering apparatus have utilized magnetic fields in order to enhance the sputtering process. Such prior art devices, however, have not achieved deposition rates high enough to be useful for many large scale deposition operations. Thus, the use of sputtering has heretofore typically been limited to the production of thin films and the like for use in relatively small devices such as semiconductors. Relatively thick deposits or deposits effected at a relatively rapid deposition rate have typically been achieved by other means than sputtering.

It is an object of the present invention to provide improved sputtering apparatus.

Another object of the invention is to provide sputtering apparatus which achieves a high rate of deposition.

It is another object of the invention to provide sputtering apparatus suitable for use in connection with large scale production operations in which relatively thick deposits or relatively high deposition rates are required.

Other objects of the invention will become apparent to those skilled in the art from the following description, taken in connection with the accompanying drawings wherein:

FIG. 1 is a top view of sputtering apparatus constructed in accordance with the invention; and FIG. 2 is a sectional view taken along the line 2—2 of FIG. 1.

Very generally, the sputtering apparatus of the invention comprises a substantially planar plate 11 having a sputtering surface 12 defined by a material to be sputtered. Magnet means 13 are provided for producing a magnetic field having lines of flux 14 which extend from the sputtering surface and return thereto to form a tunnel-like arch over an erosion (disintegration) region 15 on the sputtering surface. An anode 16 is positioned to produce an accelerating electric field adjacent the sputtering surface for producing a glow discharge plasma which is confined by the magnetic field to the region within the arch.

Referring now more particularly to the drawings, the apparatus of the invention is shown supported on a mounting flange 21. The mounting flange 21 is equipped with a seal recess 23 surrounding an opening 25 in the mounting flange. The flange is adapted to mount over a suitable opening in the wall of a sputtering chamber, not shown. A support sleeve 27 extends upwardly from the mounting flange 21 and terminates in a cathode support plate 29. A magnet support plate 31 is also supported on the sleeve 27 and extends outwardly therefrom spaced downwardly from the cathode support plate 29. An insulator washer 32 is secured to the underside of the cathode support plate by means of screws 33.

In order to cool the cathode, explained in greater detail below, a cooling plate 35 is supported on the cathode mounting plate 29, insulated therefrom by a high voltage insulator 37. The cooling plate 35 is provided with suitable coolant passages 39 therein, to and from which coolant is conducted by means of coolant tubes 41 extending upwardly through the sleeve 27. The tubes 41 are surrounded by suitable insulating sleeves 43. Annular seals 45 are provided between the high voltage insulator 37 and the coolant plate 35 and the cathode mounting plate 29 to seal the interior of the tube 27.

A cup-shaped cathode dark space shield 47 is mounted to the insulator 37 by screws 48. The cathode dark space shield 47 is of generally rectangular shape, and is provided with a peripheral flange 49 which extends upwardly and which surrounds the periphery of the cathode plate 11. The shield 47 is spaced from the cathode plate 11. The cathode plate 11 is supported on a mounting plate 50, secured to the cooling plate 35. The cathode plate 11 is secured to the plate 50 by means of a plurality of screws 51. The screws are covered by screw cap shields 53.

The cathode plate 11 is generally planar in form and is comprised of whatever the particular material is to be sputtered. The planar cathode, in an actual sputtering system, is oriented to be generally parallel with the surface or surfaces upon which the sputtered deposit is to be made. Thus, a substrate to be coated would be supported a short distance from the cathode surface to receive the atoms sputtered from the surface of the cathode plate 11, as explained in greater detail below.

The magnet means which produce the aforementioned magnetic field are supported on the magnet support plate 31. The magnet means 13 may comprise a permanent magnet, but, in the illustrated embodiment, comprise a coil 55. When current is made to flow in the coil counterclockwise as viewed in FIG. 1, the innermost portion of the magnet is of one polarity (north in the drawings) and the outer periphery is of the other polarity (south in the drawings). A pole piece 57 extends around the outer portion of the magnet 55 and a pole piece 59 extends around the inner portion of the magnet 55. A cooling tube 60 is mounted around the outer surface of the pole piece 57. A bottom shunt 61 extends between the pole pieces at the side of the magnet 55 furthest from the plate 11. The upper portions of the pole pieces 57 and 59 are not shunted and terminate immediately below the dark space shield 47, adjacent the underside of the plate 11.

As may be seen in FIG. 2, the field produced by the magnet 55 and its associated pole pieces 57 and 59 comprise lines of flux which extend from the sputtering surface 12 and return thereto to form an endless arch or tunnel over an erosion region, designated at 15. Within this arch, ionizing electrons and ionized gas are confined and concentrated to produce a glow dischage plasma and a high level of sputtering activity in the region under the arch, namely the erosion region 15.

Although the configuration of the anode 16 is relatively unimportant to the invention, it is preferred that the anode be of relatively small size compared to the cathode surface and be spaced a short distance therefrom outside the region of glow discharge confinement. In the illustrated embodiment, the anode 16 extends around the plate 11, framing it spaced from its periphery and out of the path of travel of sputtered particles moving from the sputtering surface to a substrate, and is suitably supported by means not illustrated. The anode 16 comprises a bar of relatively small cross section. Preferably, both the anode and the cathode are floated with respect to ground at a potential difference sufficient to provide the desired acceleration. For example, the anode may be allowed to self bias at a potential which is above ground, such as a potential of 50 volts. The cathode then may be maintained at a potential which is below ground, for example at about −900 volts. A suitable zener diode or similar device may be used for voltage limitation purposes.

As may be seen in FIG. 1, the configuration of the magnet means 13 is such that the magnetic field in the region just above the cathode surface or sputtering surface 12 forms a closed loop, indicated by the dotted lines 65 in FIG. 1. In this way, the electrons are confined in a sort of endless magnetic bottle adjacent the cathode and apart from the anode, further enhancing the rate of sputtering from the erosion region 15. In addition to trapping electrons, the magnetic bottle thus formed narrows the cathode dark space so that the space charge limited ion current is large. Because the cathode-anode circuit is entirely insulated from ground except through the ionized gas, there is little charge transfer to the substrate upon which the material is being deposited except for the small amount initially required to balance the cathode and anode at their natural potential, and except for a small amount due to the substrate contacting regions of the plasma at slightly different potentials.

In place of the d-c cathode supply, indicated at 67, it is possible to substitute an alternating current supply. This is because the apparatus of the invention is substantially self-rectifying due at least in part because of the presence of the magnetic field and the ratio of the areas of the anode and cathode.

The configuration of the sputtering apparatus of the invention enables manufacture of the apparatus at a cost which is much lower than most prior art devices. Moreover, the collection efficiency of a system employing the sputtering apparatus of the invention may be substantially higher than that attainable in prior art devices because the substrate can be positioned very close to the erosion region. In the event the material being sputtered is relatively brittle, the plate 11 may be comprised of a plurality of tiles or smaller segments to avoid the danger of breaking upon heating. The apparatus of the invention is capable of running at lower pressures than prior art devices for the same density of deposit.

Another extremely important advantage of the invention lies in the ability of the invention to obtain a highly uniform deposit. Because of the planar cathode, the erosion region 15 may be made in any desired configuration, depending upon the shape of the substrate upon which the deposit is being made. The glow discharge region conforms to the surface of the cathode within the arched magnetic lines, and its location and form are relatively independent of the location and form of the anode. The illustrated embodiment is designed for use in coating a moving strip, passing over the plate 11 in the direction of the arrows 69 in FIG. 1. In the region between the two parallel segments on each side of the plate 11 in FIG. 1, that is, in the region of the parallel segments on the upper and lower portions of the plate as viewed in FIG. 1, the deposition is highly uniform. Thus, a plate having a width less than the length of the long parallel segments shown in FIG. 1 passed over the cathode in the direction of the arrows 69 will be provided with a highly uniform coating across its entire width. Accordingly, the apparatus of the invention not only achieves a high deposition rate, but may be utilized in high production operations such as in connection with moving strip material.

It may therefore be seen that the invention provides improved sputtering apparatus. The apparatus of the invention is capable of achieving rates of sputtering which are substantially higher than prior art devices. The apparatus of the invention may be manufactured at a relatively low cost, and is capable of achieving a much higher collection efficiency than most prior art devices.

Various modifications of the invention in addition to those shown and described herein will become apparent to those skilled in the art from the foregoing description and accompanying drawings. Such modifications are intended to fall within the scope of the appended claims.

What is claimed is:

1. Apparatus for coating a substrate by sputtering comprising a cathode defining a substantially planar sputtering surface comprised of material to be sputtered, magnet means for producing a magnetic field having lines of flux which extend in a curve from said sputtering surface and return thereto to form an endless arch over a closed loop erosion region on said sputtering surface, an anode positioned to produce an accelerating electric field adjacent said sputtering surface for producing a glow discharge confined by said magnetic field to the region adjacent said sputtering surface and within said closed loop endless arch, said anode being outside the zone of glow discharge confinement and out of the path of travel of sputtered particles moving from the sputtering surface to a substrate, and means for connecting said cathode and said anode to a source of electrical potential.

2. Sputtering apparatus according to claim 1 wherein said closed loop erosion region has at least two parallel segments.

3. Sputtering apparatus according to claim 2 wherein said parallel segments are substantially longer than the remaining segments of said closed loop erosion region.

4. Sputtering apparatus according to claim 2 wherein said closed loop erosion region is in the outline of a rectangle.

5. Sputtering apparatus according to claim 1 wherein said magnet means comprise a magnetically permeable closed loop channel having its open side adjacent said cathode and containing an electrically conductive magnetizing coil.

6. Sputtering apparatus according to claim 1 including means for maintaining said cathode at a potential below ground and for maintaining said anode at a potential above ground.

7. In electric glow discharge sputtering apparatus for coating a substrate by the progressive disintegration of a cathode by positive ion bombardment in a low pressure environment, the improvement which comprises a cathode having a substantially planar disintegration surface, a magnet structure oriented with respect to said planar cathode to cause the magnetic flux lines emanating from such magnetic structure to project into the space adjacent the disintegration surface of the planar cathode and to intercept a finite closed loop portion of said surface to confine the glow discharge plasma to a closed loop region immediately adjacent the planar disintegration surface, and an anode outside the region of plasma confinement and out of the path of travel of sputtered particles moving from the sputtering surface to a substrate.

8. A high rate sputtering apparatus for coating a substrate with material sputtered from a substantially planar sputtering surface in a low pressure environment, comprising magnet means for maintaining a magnetic field having contiguous lines of magnetic flux which emerge from the sputtering surface, arc into the space adjacent to the sputtering surface and re-enter the sputtering surface, which magnetic flux arcs extend parallel to the sputtering surface in a configuration to form an endless magnetic tunnel overlying a closed loop portion of the sputtering surface; a first electrode underlying the entire closed loop portion of the sputtering surface; a second electrode in proximity to said first electrode but displaced from any straight line intersecting the said closed loop portion normal to the planar surface thereof; and means for connecting said first and second electrodes to a source of electric potential to establish an electric field therebetween and create a glow discharge plasma which is confined by the interaction of said magnetic and electric fields to the region closely adjacent said closed loop portion of the sputtering surface and spaced from said second electrode whereby ions from the plasma impinge on said closed loop portion of the sputtering surface causing sputtered material to be transferred from the sputtering surface to the substrate substantially without transfer of sputtered material to said second electrode.

9. Cathode sputtering apparatus for operation within an evacuable enclosure for coating a substrate which is also contained within said enclosure, said apparatus comprising: a cathode having a face of material to be sputtered; magnetic means adjacent to the cathode and at a side thereof opposite from the face, said magnetic means including a pair of magnetic poles, at least one of which is elongated, and between which there are developed magnetic lines of force, at least some of said lines of force entering and leaving said face at spaced-apart intersections therewith, and including continuously arched segments extending between said intersections which are spaced from the face, said face together with said lines of force forming a boundary of a closed area in the plane of each of the respective lines of force thereby forming a tunnel-like path within which charged particles tend to be retained, and along which they tend to move; an anode outside the said tunnel-like path in proximity to the cathode and removed from the path of travel of sputtered particles moving to the substrate, and connector means whereby said cathode and said anode can be connected to a source of electrical potential, said tunnel-like path being closed on itself whereby to form a continuous path without beginning or end, said face opening in a direction generally opposite from said side, and said path being a closed loop lying on a plane.

10. A sputtering apparatus for coating a substrate comprising:
 a cathode of material to be sputtered having a substantially planar sputtering surface;
 magnetic means for producing a magnetic field having lines of flux which extend from the sputtering surface, arc into the space adjacent the sputtering surface, and return to the sputtering surface so as to form an endless arch within which ionizing electrons are confined adjacent a closed loop erosion region on the sputtering surface, said magnetic means comprising a first pole piece which extends around a closed periphery adjacent the surface of the cathode opposite the sputtering surface and a second pole piece inside the closed periphery of the first pole piece.
 an anode outside the arch and out of the path of sputtered material moving from the erosion region to the substrate; and
 means for connecting the anode and cathode to a source of electrical potential which, when energized, produces an electric field adjacent the sputtering surface for accelerating ionized gas towards the cathode and ejecting material from the erosion region.

11. In a process utilizing a planar disintegration cathode for sputter coating a substrate supported in the path of travel of sputtered particles moving substantially normal to the planar disintegration surface the improvement which comprises increasing the cathode disintegration rate by confining the glow discharge plasma in an endless loop magnetic tunnel immediately adjacent the cathode surface and locating the anode outside the region of glow discharge plasma confinement and out of the path of travel of the sputtered particles from the disintegration surface to the substrate.

* * * * *